United States Patent
Lee

(10) Patent No.: US 8,664,649 B2
(45) Date of Patent: Mar. 4, 2014

(54) ORGANIC LIGHT-EMITTING DIODE DISPLAY AND MANUFACTURING METHOD THEREOF

(75) Inventor: Jae-Ho Lee, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 13/439,746

(22) Filed: Apr. 4, 2012

(65) Prior Publication Data

US 2013/0026533 A1    Jan. 31, 2013

(30) Foreign Application Priority Data

Jul. 29, 2011  (KR) .......................... 10-2011-0076032

(51) Int. Cl.
*H01L 51/50* (2006.01)
*H01L 51/56* (2006.01)

(52) U.S. Cl.
USPC ............. 257/40; 257/E51.02; 257/E51.018; 257/100; 438/99; 438/26; 313/512; 313/506

(58) Field of Classification Search
USPC ............. 257/40, E51.018, E51.02; 313/504, 313/506, 512; 438/99
See application file for complete search history.

(56) References Cited

U.S. PATENT DOCUMENTS

| | | | |
|---|---|---|---|
| 6,570,325 B2 | 5/2003 | Graff et al. | |
| 2004/0232832 A1* | 11/2004 | Kubota | 313/512 |
| 2007/0114521 A1* | 5/2007 | Hayashi et al. | 257/40 |
| 2012/0235207 A1* | 9/2012 | Kwack et al. | 257/100 |

FOREIGN PATENT DOCUMENTS

| | | |
|---|---|---|
| JP | 2007-005189 | 1/2007 |
| KR | 10-2004-0020793 A | 3/2004 |

* cited by examiner

*Primary Examiner* — Calvin Lee
*Assistant Examiner* — Scott Stowe
(74) *Attorney, Agent, or Firm* — Christie, Parker & Hale, LLP

(57) ABSTRACT

An organic light emitting diode display includes a substrate, an organic light emitting diode on the substrate, an organic film configured to cover the organic light emitting diode on the substrate in an organic film deposition area having a first diameter, and an inorganic film configured to cover the organic film on the substrate in an inorganic film deposition area having a second diameter, wherein L1 is the first diameter of the organic film deposition area in μm, wherein L2 is the second diameter of the inorganic film deposition area in μm, wherein D is a thickness of the organic film in μm, and wherein $L2-L1 \geq 2$ $(171D+150 \mu m)$.

8 Claims, 7 Drawing Sheets

ORGANIC LIGHT-EMITTING DIODE DISPLAY AND MANUFACTURING METHOD THEREOF

CROSS-REFERENCE TO RELATED APPLICATION

This application claims priority to and the benefit of Korean Patent Application No. 10-2011-0076032 filed in the Korean Intellectual Property Office on Jul. 29, 2011, the entire content of which is incorporated herein by reference.

BACKGROUND

1. Field

The described technology relates generally to an organic light emitting diode (OLED) display, and to a manufacturing method thereof.

2. Description of Related Art

An organic light emitting diode (OLED) display includes a hole injection electrode, an electron injection electrode, and an organic emission layer formed therebetween that emits light as holes injected from an anode and electrons injected from a cathode are recombined to become extinct at the organic light emission layer. The organic light emitting diode (OLED) display device, which has high quality properties such as low power consumption, high luminance, a high reaction speed, and the like, is receiving much attention as a next-generation display device for mobile electronic devices.

The organic light emitting diode (OLED) display includes an organic light emitting display panel including a display substrate on which thin film transistors and organic light emitting diodes (OLEDs) are formed. The organic light emitting diode includes an anode, a cathode, and an organic emission layer. Holes and electrons are injected from the anode and the cathode, respectively, to form excitons, which make a transition to a ground state, thereby causing the organic light emitting diode to emit light.

The organic light emitting diode formed with an organic material may have deteriorated performance when exposed to moisture or oxygen, and therefore, an encapsulation technique is used in the organic light emitting display panel to reduce or prevent deterioration due to moisture and oxygen.

With the thin film encapsulation technique, one or more of inorganic and organic layers are alternately deposited on the organic light emitting diodes formed at the display area of the substrate, thereby covering the display area with a thin film encapsulation layer. With the OLED display having such a thin film encapsulation layer, if the substrate is formed with a flexible film, it can be more easily bent, and is advantageous in forming a slim structure.

However, when depositing an organic film on the substrate on which the organic light emitting diodes are formed, a liquid monomer can be deposited on the substrate, and can be hardened by using electron beams or ultraviolet (UV) rays. In this instance, the organic film is deposited in a liquid state so spreading over the deposition area set by a mask may occur at an end of the organic film, that is, an edge area of the organic film. When inorganic film is formed without considering the part that is generated due to the spreading phenomenon, the end part of the organic film is not completely sealed by the inorganic film, but is instead exposed. In this case, the organic film allows for a moisture permeation path of external moisture and oxygen to deteriorate performance of the organic light emitting diode (OLED) display, and a non-display defect, which is referred to as "dark spots," can occur. When the deposition area of the inorganic film is extended more than needed to prevent the above-noted problem, a "dead space" of the display device is increased.

The above information disclosed in this Background section is only for enhancement of understanding of the background of the described technology, and therefore, it may contain information that does not form the prior art that is already known in this country to a person of ordinary skill in the art.

SUMMARY

Embodiments of the present invention provide an organic light emitting diode (OLED) display for preventing permeation of outer moisture and oxygen by applying a thin film encapsulation layer in which an organic film and an inorganic film are stacked, and a manufacturing method thereof.

Embodiments of the present invention provide an organic light emitting diode (OLED) display for reducing or minimizing a dead space of a display device by checking a deposition area of an inorganic film caused by an organic film thickness and avoiding excess deposition of an inorganic film, and a manufacturing method thereof.

Embodiments of the present invention provide an organic light emitting diode (OLED) display for reducing or minimizing dark spots and improving an encapsulation life-span, and a manufacturing method thereof.

An exemplary embodiment of the present invention provides an organic light emitting diode (OLED) display including a substrate, an organic light emitting diode on the substrate, an organic film configured to cover the organic light emitting diode on the substrate in an organic film deposition area having a first diameter, and an inorganic film configured to cover the organic film on the substrate in an inorganic film deposition area having a second diameter, wherein $L1$ is the first diameter of the organic film deposition area in μm, wherein $L2$ is the second diameter of the inorganic film deposition area in μm, wherein $D$ is a thickness of the organic film in μm, and wherein $L2-L1 \geq 2(171D+150 \text{ μm})$.

($L2-L1$) may be between 200 μm and 6000 μm, inclusive.

Another embodiment of the present invention provides a method for manufacturing an organic light emitting diode (OLED) display, the method including forming an organic light emitting diode on a side of a substrate, forming an organic film for covering the organic light emitting diode on the side of the substrate and in an organic film deposition area, and forming an inorganic film for covering the organic film on the substrate and in an inorganic film deposition area, wherein $L1$ is a diameter of the organic film deposition area in μm, $L2$ is a diameter of the inorganic film deposition area in μm, $D$ is a thickness of the organic film in μm, and $L2-L1 \geq 2(171D+150 \text{ μm})$.

($L2-L1$) may be between 200 μm and 6000 μm, inclusive.

The forming the organic film may include positioning a first mask having a first opening corresponding to the organic light emitting diode, and depositing a material of the organic film through the first opening, wherein forming the inorganic film includes positioning a second mask having a second opening corresponding to the organic film deposition area where the organic film is formed on the substrate, and depositing a material of the inorganic film through the second opening, wherein the first opening has a step in which a diameter on a rear side of the first mask facing the substrate is greater than a diameter on a surface side of the first mask opposite the rear side, wherein $L1'$ is the diameter of the first opening on the surface side of the first mask in μm, wherein L2' is a diameter of the second opening in μm, wherein A is a height of the step in μm, and wherein L2'−L1'≥2 (1.5214×10⁻³A+210 μm).

(L2'−L1') may be between 200 μm and 6000 μm, inclusive.

According to exemplary embodiments of the present invention, the inorganic film stacked on the organic film seals the organic film to efficiently control permeation of outer moisture and oxygen and to reduce or prevent resultant damage to the organic light emitting diode (OLED) display, and improves the encapsulation life-span of the organic light emitting diode.

Further, according to exemplary embodiments, the deposition area of the inorganic film caused by a thickness of the organic film is checked to prevent undesired deposition of an inorganic film, thereby increasing production efficiency and reducing or minimizing the dead space of the display device.

DETAILED DESCRIPTION

Figure 1:
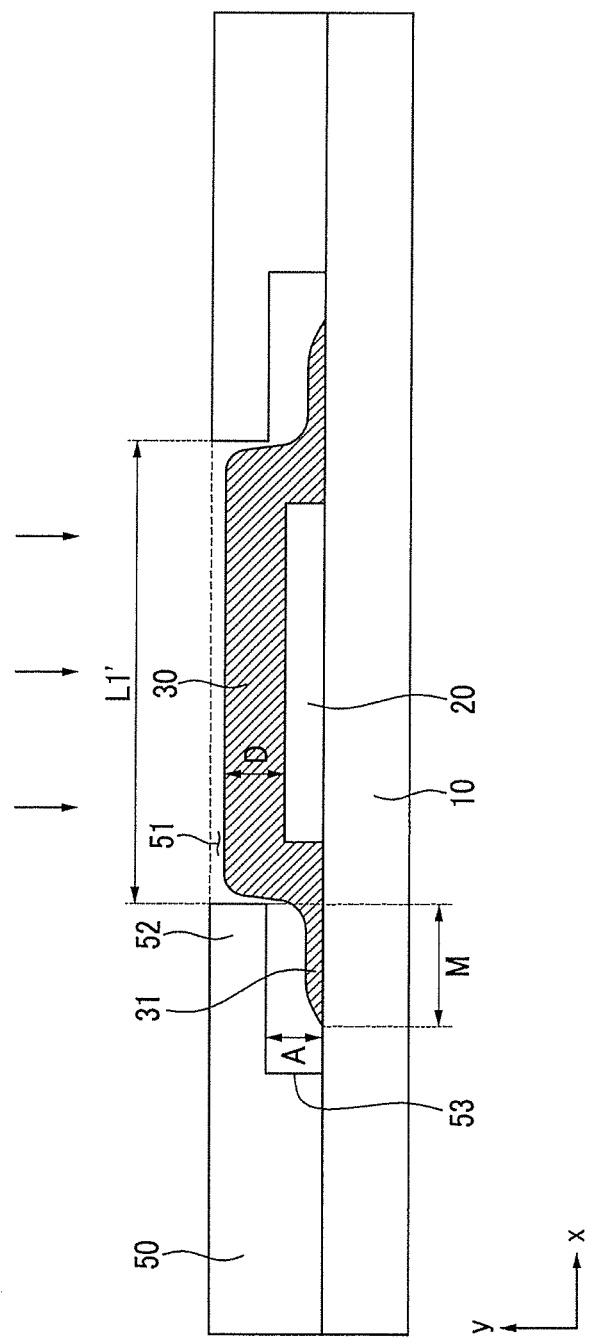
FIG. 1 and FIG. 2 show cross-sectional views corresponding to a method for manufacturing an organic light emitting diode (OLED) display according to an exemplary embodiment of the present invention.

An organic light emitting diode (OLED) display according to an embodiment of the present invention and a manufacturing method thereof will be described with reference to the accompanying drawings. However, the present invention is not limited to the exemplary embodiments disclosed hereinafter, but may be implemented in various different forms. The exemplary embodiments herein merely complete the disclosure and fully provide explanation of embodiments of the invention to the ordinarily skilled person in the art. Like reference numerals refer to like elements.

In the drawings, the thickness of layers, films, panels, regions, etc., are exaggerated for clarity. In the drawings, for understanding and ease of description, the thicknesses of some layers and areas are exaggerated. It will be understood that when an element such as a layer, film, region, or substrate is referred to as being "on" another element, it can be directly on the other element, or one or more intervening elements may be present.

In addition, unless explicitly described to the contrary, the word "comprise" and variations thereof, such as "comprises" or "comprising," will be understood to imply the inclusion of stated elements, but not the exclusion of any other elements. Further, throughout the specification, "on" implies being positioned above or below a target element, and does not necessarily imply being positioned on top with respect to the direction of gravity.

Figure 2:
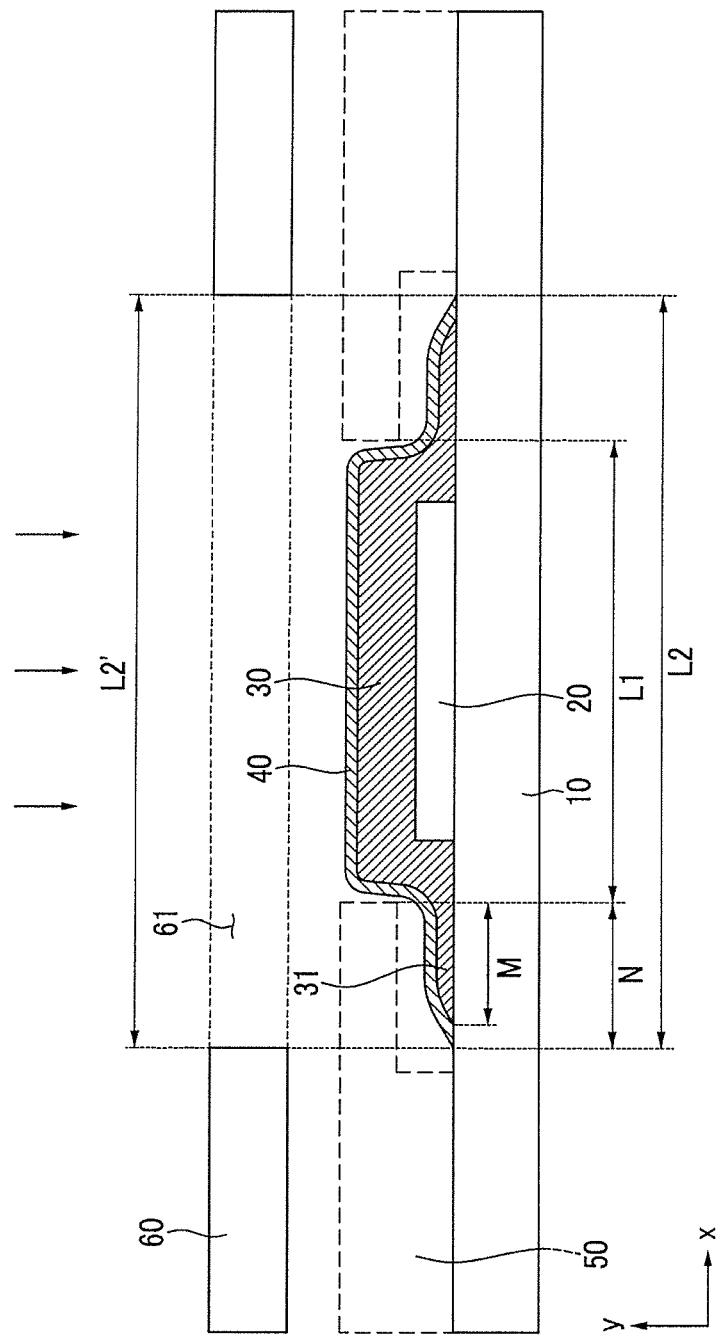
Figure 3:
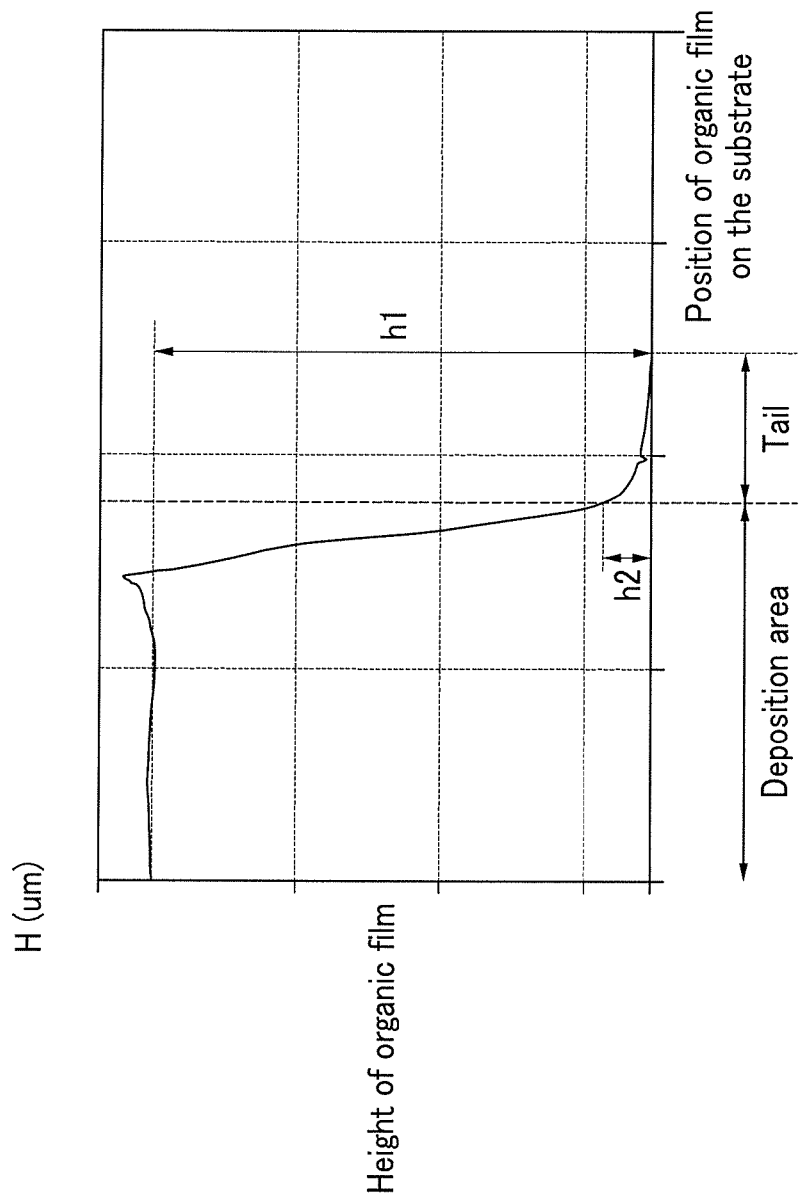
FIG. 3 shows a graph corresponding to a thickness (or height) of an organic film at a region including an edge of the organic film.

FIG. 1 and FIG. 2 show cross-sectional views corresponding to a method for manufacturing an organic light emitting diode (OLED) display according to an exemplary embodiment of the present invention, and FIG. 3 shows a graph generated by measuring a thickness (or height) of an organic film at an end, or edge region, of the organic film.

Referring to FIG. 1 and FIG. 2, the organic light emitting diode (OLED) display includes a substrate 10, and includes an organic film 30 and an inorganic film 40 for encapsulating an organic light emitting diode 20 formed on the substrate 10.

According to the present embodiment, the substrate 10 includes at least one of glass, polymer, and metal, and is made of a light transmissive, light reflective, or light absorptive material. The substrate 10 is flexible. A wire (not shown) and the organic light emitting diode 20 are provided on the substrate 10. The wire transmits a signal to the organic light emitting diode 20 to drive the organic light emitting diode 20. The organic light emitting diode 20 emits light according to the signal transmitted by the wire.

The organic light emitting diode 20 includes, although not shown in FIGS. 1 and 2, an anode electrode, an organic emission layer, and a cathode electrode, while the organic emission layer further includes organic layers for transmitting carriers of holes or electrons to an emission layer, as well as the emission layer for emitting light. The organic layers, for example, can be a hole injection layer (HIL) and a hole transport layer (HTL) provided between the anode and the emission layer, and can be an electron injection layer (EIL) and an electron transport layer (ETL) provided between the cathode and the emission layer.

When a voltage (e.g., a predetermined voltage) is applied to the anode and cathode, the holes injected by the anode are moved to the emission layer by passing through the hole transport layer (HTL) configuring the emission layer, and the electrons injected by the cathode electrode are injected to the emission layer by passing through the electron transport layer (ETL). In this instance, the electrons and the holes are recombined in the emission layer to generate excitons, and the excitons are changed to the ground state from the excited state so that fluorescent molecules of the emission layer emit light to form an image. The organic light emitting diode 20 is provided on the substrate 10, and receives the signal from the wire, and displays the image according to the signal. A pixel represents the minimum unit for displaying an image, and the organic light emitting diode (OLED) display displays images by using a plurality of pixels.

Performance of the organic light emitting diode 20 is deteriorated when reacted with moisture or oxygen. So, to reduce or prevent deterioration, the organic film 30 and the inorganic film 40, which are for shielding and protecting the organic light emitting diode 20 from external factors as a thin film encapsulation layer, are sequentially stacked on the organic light emitting diode 20.

The organic film 30 represents a thin film for preventing permeation of moisture and oxygen by shielding or protecting the organic light emitting diode 20 from the outside (e.g., from external conditions), and for example, the organic film 30 can be made of an organic material, such as epoxy resin or acryl resin, and the organic material may have a thermal hardening or UV hardening property. The organic film 30 is deposited as a liquid on the organic light emitting diode 20 so as to be substantially flattened or smoothed thereon, thereby enabling a spreading phenomenon for flowing over a predetermined deposition area set by the mask at the end of the organic film 30, that is, the edge area of the organic film 30 (refer to FIGS. 1-3). That is, as shown in FIG. 3, when a deposition height of the organic film 30 in the width direction (i.e., the x-axis direction of FIG. 3) is considered at the end, or edge area, of the organic film 30, the height is discontinuously changed at a part where the deposition area is stopped, and a part, or area, where the height of the organic film 30 is abruptly reduced is generated, this part or area being called a tail 31 (see FIGS. 1 and 2). According to the present embodiment, the tail 31 is defined to be an edge part, where the height h2 is substantially below 5% of the average height h1 of the deposition area of the organic film 30. A length M of the tail 31 may vary corresponding to the deposition thickness D of the organic film 30, and the tail 31 length M caused by the thickness D of the organic film 30 checked by experimental results is expressed in Table 1.

TABLE 1

| Organic film thickness (Å) | Tail length (μm) |
|---|---|
| 1000 | 150 |
| 5000 | 230 |
| 10000 | 310 |
| 20000 | 479 |

Figure 4:
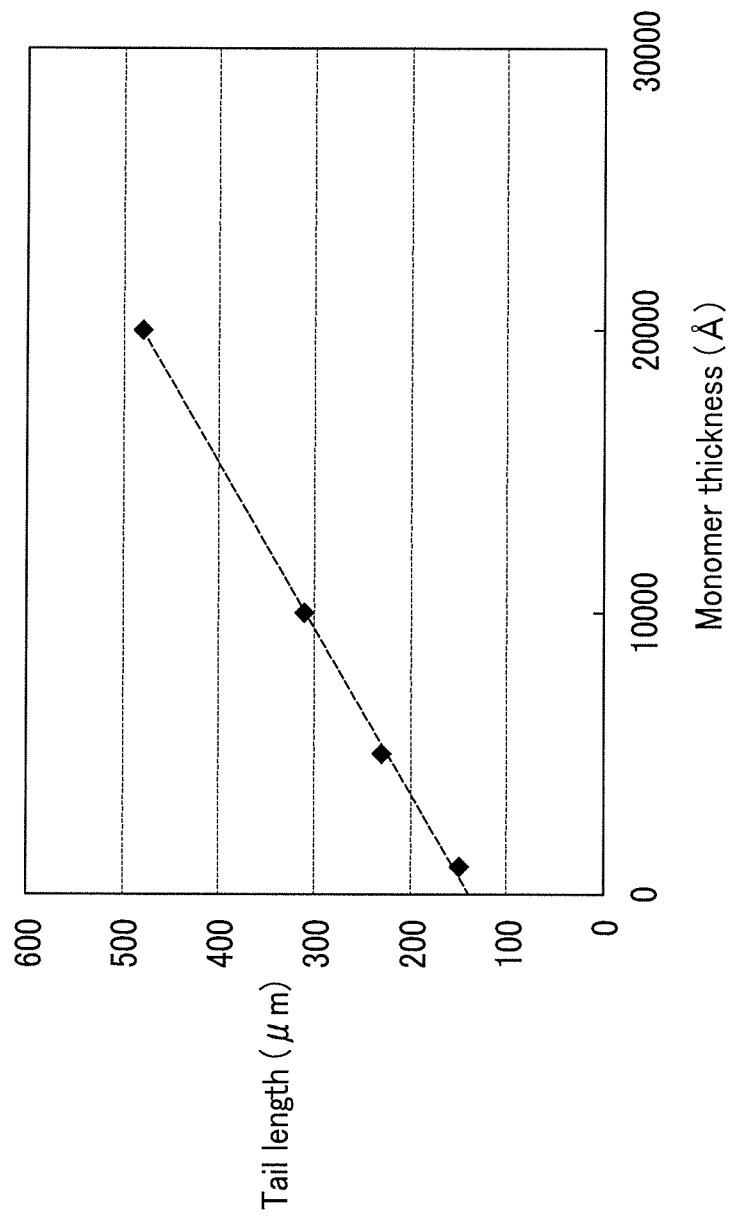
FIG. 4 shows a graph indicating a correlation between a length of an organic film tail and a thickness of an organic film.

The organic film thickness (D) and the tail length (M) have a relation satisfying Equation 1 (below), which approximates the experimental results of Table 1, and which is depicted in FIG. 4. Here, the unit of M and D is μm.

$$M = 171D + 138.14 \, \mu m \quad \text{Equation 1}$$

(M: length of tail, D: thickness of organic film, refer to FIGS. 1 and 2)

The organic film 30 is efficient in relaxing the stress of the organic light emitting diode (OWED) display. However, the organic film might be a moisture permeation path of outer moisture and oxygen. Accordingly, the organic film 30 is covered with the inorganic film 40. The inorganic film 40 is coated on the organic film 30 to shield the organic film 30 from the outside, and the inorganic film 40 can be used by selecting from a material or metal having refined glass particulates, and inorganic materials, such as, for example, an oxide, nitride, or ceramic.

The deposition area of the inorganic film 40 is formed to be greater than the deposition area of the organic film 30, and a the inorganic film 40 surrounds the edge (e.g., periphery) of the organic film 30 to seal the organic film 30. The inorganic film 40 is desirably formed to have a size in consideration of the tail 31 to exceed the deposition area of the organic film 30. Therefore, in consideration that the inorganic film 40 covers the formation area of the tail 31, according to the present embodiment, a diameter L2 of the deposition area of the inorganic film 40 is longer by an amount corresponding to the length (M) of the tail 31 and the thickness (D) of the inorganic film 40 from the diameter L1 of the deposition area of the organic film 30, which can be written as Equation 2, referring to FIG. 2. Here, N represents a length of the inorganic film 40 that covers the tail 31 of the organic film 30.

$$L2 \geq L1 + 2N, N = 171D + 150 \, \mu m$$

$$L2 - L1 \geq 2(171D + 150 \, \mu m) \quad \text{Equation 2}$$

When the inorganic film 40 is formed with the relation corresponding to Equation 2, it can cover the organic film 30 when the tail 31 occurs because of deposition of the liquid organic film 30. That is, when the thickness of the deposited organic film 30 is checked, a range of the deposition area of the corresponding inorganic film 40 is set to allow the inorganic film 40 to cover the organic film 30 and block, or shield, the organic film 30 from the outside. Therefore, the organic light emitting diode (OLED) display can efficiently reduce or control permeation of the external moisture and oxygen.

Further, according to results achieved through experiments, it is desirable for the difference (L2−L1) between the diameter L2 of the inorganic film deposition area and the diameter L1 of the organic film deposition area to be between 200 μm and 6000 μm. When the diameter difference (L2−L1) of the deposition area is less than 200 μm, the effect of sealing the organic film 30 by the inorganic film 40 is reduced, and when the diameter difference (L2−L1) is greater than 6000 μm, more of the inorganic film 40 is deposited than needed, thereby reducing production efficiency.

The above-described stacking configuration of the organic film 30 and the inorganic film 40 is applicable to embodiments in which the organic film 30 and the inorganic film 40 are repeatedly stacked multiple times in a like manner.

Referring to FIG. 1 and FIG. 2, a method for manufacturing an organic light emitting diode (OLED) display according to an exemplary embodiment of the present invention will now be described.

The method for manufacturing an organic light emitting diode (OLED) display includes: forming an organic light emitting diode 20 on a side of the substrate 10; forming an organic film 30 on the substrate 10 on which the organic light emitting diode 20 is formed to cover the organic light emitting diode 20; and forming an inorganic film 40 on the substrate 10 to cover the organic film 30.

The organic light emitting diode 20 is formed on one side of the substrate 10, which corresponds to the above description, and will not be described again.

An organic film 30 is formed on the substrate 10 to cover the organic light emitting diode 20. When the organic film 30 is formed, a mask (e.g., a predetermined mask) in which a deposition area is set can be used, a first mask 50 including a first opening 51 corresponding to the size and the form of the organic light emitting diode 20 is located on or near the substrate 10 to cover the organic light emitting diode 20, and an organic film material 30 to be deposited from a deposition source (not shown) is deposited on the organic light emitting diode 20 through the first opening 51. The material of the organic film 30 is deposited on the organic light emitting diode 20 with a thickness (e.g., a predetermined thickness) D to form the organic film 30 covering the edge of the organic light emitting diode 20. The thickness D of the organic film 30 corresponds to the material of the organic light emitting diode 20, the material of the organic film 30, and relevant processes.

The organic film 30 is deposited as a liquid on the organic light emitting diode 20 so as to be fluently flattened and smoothed, and a tail 31 is generated by the spreading phenomenon at the edge of the organic film 30, as shown in FIG. 1. The tail 31 (e.g., the length M of the tail 31) has the relation of above-described Equation 1 in connection with the thickness D of the organic film 30. The deposited organic film 30 is made of a thermal hardening resin that is hardened by application of heat or ultraviolet light (e.g., light with a wavelength of 200-400 nm), and the hardening resin is hardened by the UV rays, so it causes a chemical reaction when heat is applied during the process, and a crosslink occurs as a result of the chemical reaction to make it substantially insoluble and hardened.

When the organic film 30 is formed, an inorganic film 40 for covering the organic film 30 is formed on the organic film 30. When the inorganic film 40 is formed, a mask in which the deposition area is set can be used in a like manner of forming the organic film 30, a second mask 60 including a second opening 61 corresponding to the form and the size of the organic film 30 is located on or near the substrate 10 so as to cover the organic film 30, and an inorganic film material 40 to be deposited from the deposition source is deposited on the organic film 30 through the second opening 61. The inorganic film material 40 is deposited on the organic film 30 with a predetermined thickness to form the inorganic film 40 covering the edge of the organic film 30.

Particularly, the inorganic film 40 is deposited with a diameter that satisfies Equation 2 so as to cover the tail 31, as described above. When the inorganic film 40 is formed with the relation following Equation 2, the organic film 30 can be covered when the tail 31 is generated due to the deposition of the liquid organic film 30. That is, when the thickness D of the deposited organic film 30 is checked, the organic film 30 can be covered from the outside by setting the range of the deposition area of the inorganic film 40. Therefore, the organic light emitting diode (OLED) display can efficiently reduce permeation of the external moisture and oxygen. Further, as described, according to the present embodiment, it is desirable for the difference (L2−L1) between the diameter L2 of the inorganic film deposition area and the diameter L1 of the organic film deposition area to be between 200 µm and 6000 µm.

In addition, regarding the first mask 50 used to form the organic film 30, the first opening 51 can be formed with two stages, and in this instance, the first opening 51 has a two step configuration including a step 53 in which the diameter of a rear side (i.e., the side that faces the substrate) of the first mask 50 facing the substrate 10 is greater than the diameter on the surface side (i.e., the side opposite to the rear side and facing away from the substrate). When the first mask 50 is configured with two stages, a problem of protrusions and depressions at the end of the tail 31, or attachment of particles thereto, can be reduced or prevented when the organic material 30 is deposited as a liquid, and a tail 31 is generated because of the spreading phenomenon.

Figure 5:
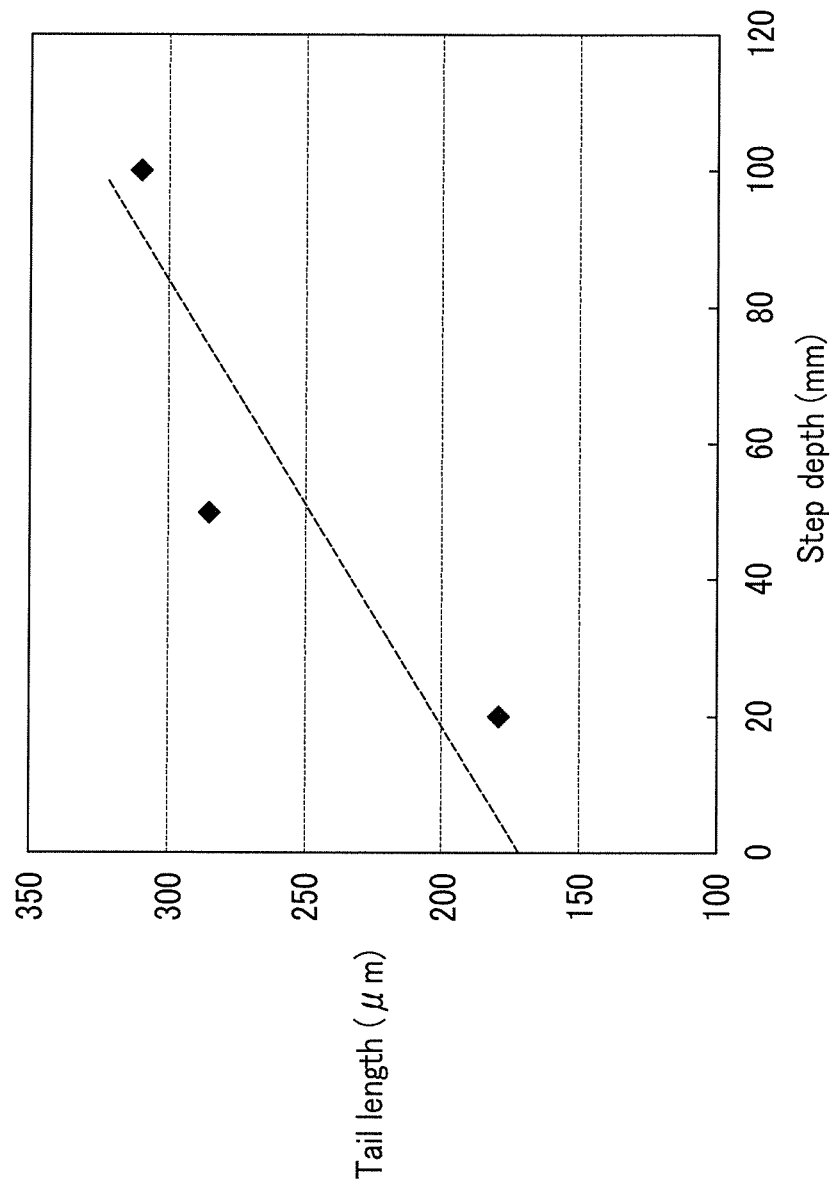
FIG. 5 shows a graph indicating a correlation between a length of an organic film tail and a height of a step of an organic film mask.

According to the present embodiment, the length of the organic film tail 31 is variable corresponding to the height A of the step 53 in the two-stage configuration, and FIG. 5 shows a graph depicting a correlation of the length M of the organic film tail 31 and the height A of the step 53 of the organic film mask 50 when the organic film 30 is deposited with the thickness (or height) D of 5000 Å. An approximate relationship between the height (A) of the step 53 of the organic film mask 50 and the length (M) of the organic film tail 31, as found through experiments, is expressed in Equation 3 (the unit of variables A and M being µm).

$$M = 1.5214 \times 10^{-3} A + 171.79 \text{ µm} \qquad \text{Equation 3}$$

When the inorganic film 40 is formed by considering the length M of the tail 31, the diameter L2 of the deposition area of the inorganic film 40 must be formed to be longer than the diameter L1 of the deposition area of the organic film 30 by at least the length (M) of the tail 31. The second opening 61 of the second mask 60 is formed to have a size for enabling covering of the organic film 30 and corresponding to the deposition area of the organic film 30, so the diameter (L2') of the second opening 61 of the second mask 60 corresponds to the diameter L2 of the deposition area of the inorganic film 40. In a like manner, the diameter (the surface side L1') of the first opening 51 of the first mask 50 corresponds to the diameter L1 of the deposition area of the organic film 30. This is expressed in Equation 4 with reference to FIG. 1 and FIG. 2.

$$L2' \geq L1' + 2N, N = 1.5214 \times 10^{-3} A + 210 \text{ µm}$$

$$L2' - L1' \geq 2(1.5214 \times 10^{-3} A + 210 \text{ µm}) \qquad \text{Equation 4}$$

(L1': the diameter on the surface side of the first opening, L2': the diameter of the second opening, A: the height of the step, and N: the length of the inorganic film covering the tail of the organic film, wherein the unit for variables L1', L2', A, and N is µm)

When the inorganic film 40 is formed following Equation 4, the organic film 30 can be covered when the tail 31 occurs because of deposition of the liquid organic film 30.

EXPERIMENTAL EXAMPLE

An effect of an organic light emitting diode (OLED) display according to an exemplary embodiment of the present invention will be described by comparing an organic light emitting diode (OLED) display according to a comparative example and an organic light emitting diode (OLED) display according to the exemplary embodiment of the present invention.

Figure 6:
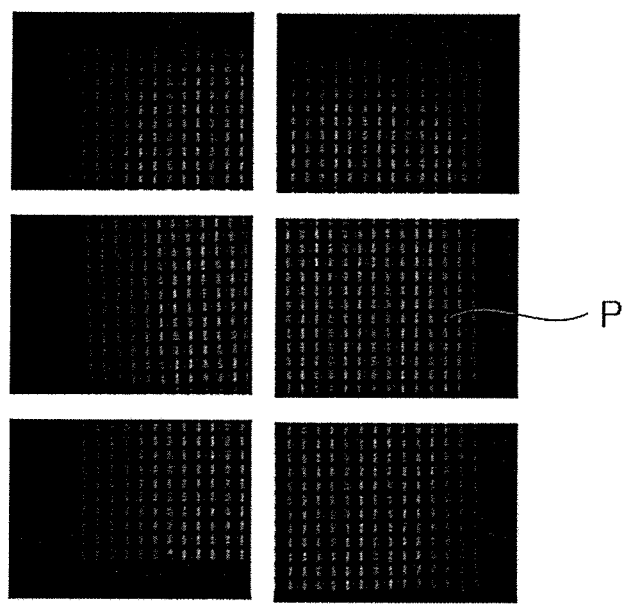
FIG. 6 shows a photograph of a turned-on organic light emitting diode (OLED) display that was manufactured according to a comparative example in a high temperature and high humidity condition.
Figure 7:
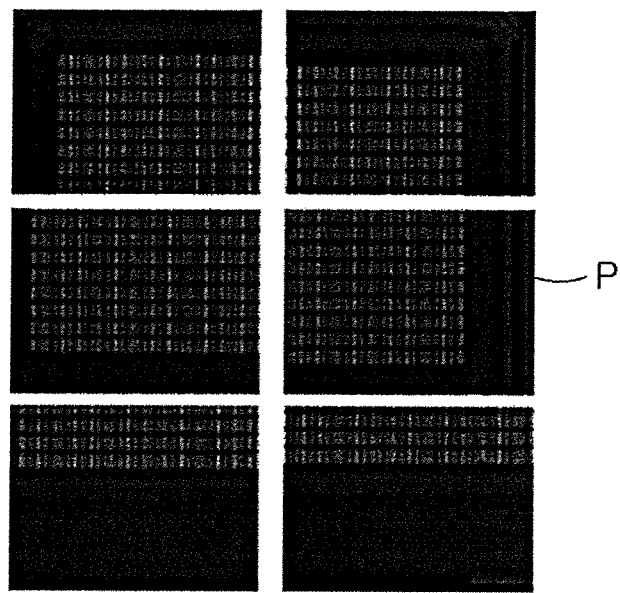
FIG. 7 shows a photograph of a turned-on organic light emitting diode (OLED) display manufactured according to an exemplary embodiment of the present invention in a high temperature and high humidity condition.

FIG. 6 shows a photograph of an organic light emitting diode (OLED) display that is manufactured, according to a comparative example, in a high temperature and high humidity condition, the organic light emitting diode (OLED) display being turned on, and FIG. 7 shows a photograph of an organic light emitting diode (OLED) display that is manufactured according to an exemplary embodiment of the present embodiment in a high temperature and high humidity condition, the organic light emitting diode (OLED) display being turned on.

In the comparative example of FIG. 6, the thickness (D) of the organic film is set to be 5000 Å for deposition, and the organic light emitting diode (OLED) display, which is manufactured by setting both lengths of the diameter L2 of the deposition area of the inorganic film 40 to be greater than the diameter L1 of the deposition area of the organic film 30 by 200 µm, is exposed for 295 hours in a high-temperature and high-humidity condition. When the organic film is set to have the thickness (D) of 5000 Å and is deposited in a like manner as the comparative example, the tail is formed to have the length of 230 µm, and the inorganic film cannot fully cover the tail because the diameter L2 of the deposition area of the inorganic film 40 is less than the sum of the diameter L1 of the deposition area of the organic film 30 and the lengths of the tails at both ends (i.e., it fails to satisfy Equation 2) in the comparative example. In this case, moisture and oxygen are permeated to the edge of the organic light emitting diode (OLED) display so the pixels (P) on the edge fail to emit clear light, differing from the pixels in the center part as shown in FIG. 6.

In the exemplary embodiment of the present invention depicted in FIG. 7, the organic film 30 is set to have the thickness (D) of 5000 Å, and is then deposited, and the organic light emitting diode (OLED) display, which is manufactured by setting the length of the diameter L2 of the deposition area of the inorganic film 40 to be greater than the diameter L1 of the deposition area of the organic film 30 by 300 µm, respectively, is exposed for 800 hours in a high-temperature and high-humidity condition. In the present exemplary embodiment, the diameter L2 of the deposition area of the inorganic film 40 is greater than the sum of the lengths (M) of the tails 31 at both ends and the diameter L1 of the deposition area of the organic film 30 (i.e., it satisfies Equation 2), so the inorganic film 40 can fully cover the tail 31 of the organic film 30. In this case, even though the organic light emitting diode (OLED) display is exposed for a long time (e.g., over 500 hours) in the high temperature and high humidity condition, the pixels (P) on the edge emit clear light in a manner similar to that of the pixels in the center, as shown in FIG. 7.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims, and their equivalents.

What is claimed is:

1. A method for manufacturing an organic light emitting diode (OLED) display, the method comprising:
    forming an organic light emitting diode on a side of a substrate;
    depositing a liquid organic film through a first opening in a first mask to cover the organic light emitting diode, and hardening the organic film; and
    depositing an inorganic film through a second opening in a second mask to cover the organic film,
    wherein the first opening has a step,
    wherein $L1'$ is a diameter of the first opening in μm,
    wherein $L2'$ is a diameter of the second opening in μm,
    wherein $A$ is a height of the step in μm, and
    wherein $L2'-L1' \geq 2\ (1.5214 \times 10^{-3} A + 210\ \mu m)$.

2. A method for manufacturing an organic light emitting diode (OLED) display, the method comprising:
    forming an organic light emitting diode on a side of a substrate;
    forming an organic film for covering the organic light emitting diode on the side of the substrate and in an organic film deposition area; and
    forming an inorganic film for covering the organic film on the substrate and in an inorganic film deposition area,
    wherein $L1$ is a diameter of the organic film deposition area in μm, $L2$ is a diameter of the inorganic film deposition area in μm, $D$ is a thickness of the organic film within the organic film deposition area in μm, and $L2-L1 > 2\ (171D+150\mu m)$,
    wherein the organic film is generated through spreading and hardening of a liquid organic material such that the thickness of the organic film abruptly changes at a boundary of the organic film deposition area and a tail having a gradual thickness change is formed outside of the organic film deposition area.

3. The method of claim 2, wherein $200\ \mu m \leq (L2-L1) \leq 6000\ \mu m$.

4. A method for manufacturing an organic light emitting diode (OLED) display, the method comprising:
    forming an organic light emitting diode on a side of a substrate;
    forming an organic film for covering the organic light emitting diode on the side of the substrate and in an organic film deposition area; and
    forming an inorganic film for covering the organic film on the substrate and in an inorganic film deposition area,
    wherein forming the organic film comprises: positioning a first mask having a first opening corresponding to the organic light emitting diode; and depositing a material of the organic film through the first opening,
    wherein forming the inorganic film comprises: positioning a second mask having a second opening corresponding to the organic film deposition area where the organic film is formed on the substrate; and depositing a material of the inorganic film through the second opening,
    wherein the first opening has a step in which a diameter of the first opening on a rear side of the first mask facing the substrate is greater than a diameter of the first opening on a surface side of the first mask opposite the rear side,
    wherein $L1'$ is the diameter of the first opening on the surface side of the first mask in μm,
    wherein $L2'$ is a diameter of the second opening in μm,
    wherein $A$ is a height of the step in μm, and
    wherein $L2'-L1' \geq 2\ (1.5214 \times 10^{-3} A + 210\ \mu m)$.

5. The method of claim 4, wherein $200\ \mu m \leq (L2'-L1') \leq 6000\ \mu m$.

6. An organic light emitting diode (OLED) display comprising:
    a substrate;
    an organic light emitting diode on the substrate;
    an organic film configured to cover the organic light emitting diode on the substrate in an organic film deposition area having a first diameter; and
    an inorganic film configured to cover the organic film on the substrate in an inorganic film deposition area having a second diameter, wherein $L1$ is the first diameter of the organic film deposition area in μm, wherein $L2$ is the second diameter of the inorganic film deposition area in μm, wherein $D$ is a thickness of the organic film within the organic film deposition area in μm, and wherein $L2-L1 \geq 2\ (171D+150\ \mu m)$,
    wherein the organic film is generated through spreading of a liquid organic material such that the thickness of organic film abruptly changes at a boundary of the organic film deposition area and such that a tail having a gradual thickness change is formed outside of the organic film deposition area.

7. The organic light emitting diode display of claim 6, wherein $200\ \mu m \leq (L2-L1) \leq 6000\ \mu m$.

8. The organic light emitting diode display of claim 6, wherein the organic film comprises a hardened liquid-deposited organic film.

* * * * *